(12) United States Patent
Anderson

(10) Patent No.: US 9,652,513 B2
(45) Date of Patent: *May 16, 2017

(54) GENERATING DATA PATTERN INFORMATION

(71) Applicant: Ab Initio Technology LLC, Lexington, MA (US)

(72) Inventor: Arlen Anderson, Kidlington (GB)

(73) Assignee: Ab Initio Technology, LLC, Lexington, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/954,434

(22) Filed: Nov. 30, 2015

(65) Prior Publication Data
US 2016/0078100 A1    Mar. 17, 2016

Related U.S. Application Data

(63) Continuation of application No. 13/360,230, filed on Jan. 27, 2012, now Pat. No. 9,449,057.

(60) Provisional application No. 61/437,361, filed on Jan. 28, 2011.

(51) Int. Cl.
*G06F 17/30* (2006.01)
*H03M 7/30* (2006.01)

(52) U.S. Cl.
CPC .. *G06F 17/30542* (2013.01); *G06F 17/30321* (2013.01); *G06F 17/30371* (2013.01); *H03M 7/30* (2013.01); *G06F 17/30289* (2013.01)

(58) Field of Classification Search
None
See application file for complete search history.

(56) References Cited

U.S. PATENT DOCUMENTS

| 5,179,643 A | 1/1993 | Homma et al. |
| 5,742,806 A | 4/1998 | Reiner et al. |
| 5,842,200 A | 11/1998 | Agrawal et al. |

(Continued)

FOREIGN PATENT DOCUMENTS

| EP | 1302871 | 4/2003 |
| JP | 03-002938 | 1/1991 |

(Continued)

OTHER PUBLICATIONS

Alur et al. "IBM Websphere Information Analyzer and Data Quality Assessment", ibm.com/redbooks, Dec. 2007 p. 1-642, Retrieved from the Internet URL:http://www.ibm.com/redbooks/pdfs/sg247508.pdf.

(Continued)

*Primary Examiner* — Hung Q Pham
(74) *Attorney, Agent, or Firm* — Occhiuti & Rohlicek LLP

(57) ABSTRACT

A data storage system stores at least one dataset including a plurality of records. A data processing system, coupled to the data storage system, processes the plurality of records to produce codes representing data patterns in the records, the processing including: for each of multiple records in the plurality of records, associating with the record a code encoding one or more elements, wherein each element represents a state or property of a corresponding field or combination of fields as one of a set of element values, and, for at least one element of at least a first code, the number of element values in the set is smaller than the total number of data values that occur in the corresponding field or combination of fields over all of the plurality of records in the dataset.

52 Claims, 5 Drawing Sheets

(56) References Cited

U.S. PATENT DOCUMENTS

| | | |
|---|---|---|
| 5,845,285 A | 12/1998 | Klein |
| 5,966,072 A | 10/1999 | Stanfill et al. |
| 6,134,560 A | 10/2000 | Kliebhan |
| 6,138,123 A | 10/2000 | Rathbun |
| 6,163,774 A | 12/2000 | Lore et al. |
| 6,343,294 B1 | 1/2002 | Hawley |
| 6,553,366 B1 | 4/2003 | Miller et al. |
| 6,601,048 B1 | 7/2003 | Gavan et al. |
| 6,657,568 B1 | 12/2003 | Coelho et al. |
| 6,741,995 B1 | 5/2004 | Chen et al. |
| 6,788,302 B1 | 9/2004 | Ditlow et al. |
| 6,801,938 B1 | 10/2004 | Bookman et al. |
| 6,959,300 B1 | 10/2005 | Caldwell et al. |
| 7,013,290 B2 | 3/2006 | Ananian |
| 7,047,230 B2 | 5/2006 | Gibbons |
| 7,058,819 B2 | 6/2006 | Okaue |
| 7,117,222 B2 | 10/2006 | Santosuosso |
| 7,376,656 B2 | 5/2008 | Blakeley et al. |
| 7,403,942 B1 | 7/2008 | Bayliss |
| 7,433,861 B2 | 10/2008 | Santosuosso |
| 7,698,163 B2 | 4/2010 | Reed et al. |
| 7,756,873 B2 | 7/2010 | Gould et al. |
| 7,813,937 B1 | 10/2010 | Pathria et al. |
| 7,849,075 B2 | 12/2010 | Gould et al. |
| 8,145,642 B2 | 3/2012 | Cruanes et al. |
| 8,296,274 B2 | 10/2012 | Leppard |
| 2002/0120602 A1 | 8/2002 | Overbeek et al. |
| 2002/0161778 A1 | 10/2002 | Linstedt |
| 2002/0198877 A1 | 12/2002 | Wolff et al. |
| 2003/0023868 A1 | 1/2003 | Parent |
| 2003/0033138 A1 | 2/2003 | Bangalore et al. |
| 2003/0140027 A1 | 7/2003 | Huttel et al. |
| 2004/0023666 A1 | 2/2004 | Moon et al. |
| 2004/0049492 A1 | 3/2004 | Gibbons |
| 2004/0073534 A1 | 4/2004 | Robson |
| 2004/0083199 A1 | 4/2004 | Govindugari et al. |
| 2004/0111410 A1 | 6/2004 | Burgoon et al. |
| 2004/0181514 A1 | 9/2004 | Santosuosso |
| 2004/0181533 A1 | 9/2004 | Santosuosso |
| 2004/0249810 A1 | 12/2004 | Das et al. |
| 2004/0260711 A1 | 12/2004 | Chessell et al. |
| 2005/0048564 A1 | 3/2005 | Emili |
| 2005/0055369 A1 | 3/2005 | Gorelik |
| 2005/0065914 A1 | 3/2005 | Chang et al. |
| 2005/0071320 A1 | 3/2005 | Chkodrov et al. |
| 2005/0102325 A1 | 5/2005 | Gould |
| 2005/0114368 A1 | 5/2005 | Gould et al. |
| 2005/0114369 A1 | 5/2005 | Gould et al. |
| 2005/0177578 A1 | 8/2005 | Chen et al. |
| 2005/0192994 A1 | 9/2005 | Caldwell et al. |
| 2005/0240354 A1 | 10/2005 | Mamou |
| 2006/0041544 A1 | 2/2006 | Santosuosso |
| 2006/0069717 A1 | 3/2006 | Mamou |
| 2006/0294055 A1 | 12/2006 | Santosuosso |
| 2007/0050381 A1 | 3/2007 | Hu et al. |
| 2007/0073721 A1 | 3/2007 | Belyy et al. |
| 2007/0288490 A1 | 12/2007 | Longshaw |
| 2007/0299832 A1 | 12/2007 | Chang et al. |
| 2008/0215602 A1 | 9/2008 | Samson et al. |
| 2008/0222089 A1 | 9/2008 | Stewart et al. |
| 2008/0306920 A1 | 12/2008 | Santosuosso |
| 2009/0216717 A1 | 8/2009 | Suereth et al. |
| 2009/0226916 A1 | 9/2009 | DeSimas |
| 2010/0057777 A1 | 3/2010 | Williamson |
| 2010/0114976 A1 | 5/2010 | Castellanos |
| 2010/0250563 A1 | 9/2010 | Cao et al. |
| 2011/0066602 A1 | 3/2011 | Studer et al. |
| 2011/0119221 A1 | 5/2011 | Mishra |
| 2011/0137940 A1 | 6/2011 | Gradin |
| 2011/0153667 A1 | 6/2011 | Parmenter et al. |
| 2011/0225191 A1 | 9/2011 | Xie |
| 2011/0313979 A1 | 12/2011 | Roberts |
| 2012/0197887 A1 | 8/2012 | Anderson |
| 2012/0281012 A1 | 11/2012 | Neway |
| 2012/0323927 A1 | 12/2012 | Froemmgen |
| 2013/0024430 A1 | 1/2013 | Gorelik |
| 2013/0159353 A1 | 6/2013 | Fuh |
| 2013/0166576 A1 | 6/2013 | Hudzia et al. |

FOREIGN PATENT DOCUMENTS

| | | |
|---|---|---|
| JP | H07-502617 | 3/1995 |
| JP | 08-030637 | 2/1996 |
| JP | 10-055367 | 2/1998 |
| JP | 10-091633 | 4/1998 |
| JP | 10-320423 | 12/1998 |
| JP | 11-238065 | 8/1999 |
| JP | 2001-43237 | 2/2001 |
| JP | 2002-024262 | 1/2002 |
| WO | WO 00/57312 | 9/2000 |
| WO | WO 00/79415 | 12/2000 |
| WO | WO 03/071450 | 8/2003 |
| WO | WO2005/029369 | 3/2005 |

OTHER PUBLICATIONS

Apte, Chidanand, et al., "Business Application for Data Mining," Aug. 2002, Communications of the ACM, vol. 45, No. 8, pp. 49-53.

"Ascential" http://www.ascentialsoftware.com (2003).

"Avellino" http://www.avellino.com (2003).

Bagchi et al.. "Dependency Interference Algorithms for Relational Database Design." Computers in Industry 14 (1990) 319-350.

Bell et al.. "Discovery of Data Dependencies in Relational Databases." LS-8 Report 14, Dortmund, Apr. 3, 1995 1-18.

Bell et al. "Discovery of Data Dependencies in Relational Databases" Research Reports of the Unit No. VIII (AI), Computer Science Department of Dortmund, DE, Apr. 1995, pp. 1-18.

Bitton et al.. "A Feasibility and Performance Study of Dependency Inference." Department of Electrical Engineering and Computer Science, University of Illinois at Chicago (1989) 635-641.

Brown et al. . "BHUNT: Automatic Discovery of Fuzzy Algebraic Constraints in Relational Data." 29$^{th}$ VLDB Conference, Sep. 9, 2003, XP-002333907.

Bruno et al.. "Efficient Creation of Statistics over Query Expressions." The Computer Society (2003) 201-212.

Chaudhuri, S., "An Overview of Query Optimization in Relational Systems", XP-000782631, pp. 34-43 (1998).

Dasu et al. "Mining Database Structure; Or, How to Build a Data Quality Browser." ACM SIGMOD 2002 Conference, Jun. 4, 2002, XP-002333902, 240-251.

"Data Profiling: The Foundation for Data Management", prepared by DataFlux Corporation, XP-002313258, (2004).

"Evoke", http://www.evokesoftware.com, (2003).

USPTO Non-Final Office Action issued for U.S. Appl. No. 10/941,401, mailed Jul. 21, 2009, 32 pages.

Examination Report in Canadian Application No. 2,655,735 dated May 4, 2009, 2 pages.

Examination Report in Canadian Application No. 2,655,731 dated Dec. 3, 2009, 3 pages.

Examiner's Report in Australian Application No. 2009200294, dated Jun. 12, 2012, 3 pages.

Florescu, Daniela et al., "A Performance Evaluation of Alternative Mapping Schemes for Storing XML Data in a Relational Database," May 1999, http://www.caravel.inria.fr/Fmbrepubs_dana.html, 31 pages.

Graefe, Goetz. "Query Evaluation Techniques for Large Databases." ACM Computing Surveys, vol. 25, No. 2, Jun. 1993, 98 pages.

Henrard et al.. "Data Dependency Elicitation in Database Reverse Engineering." Institut d'Informattique, University of Namur, Belgium, (2001), 11-19.

Huhtala, Y. et al., "Efficient Discovery of Functional and Approximate Dependencies Using Partitions (Extended Version)," University of Helsinki, Department of Computer Science Series of Publications C, Report C-1997-79, Nov. 1997.

Huhtala, Y. et al., "Efficient Discovery of Functional and Approximate Dependencies Using Paritions," Proceedings of the 14$^{th}$ International Conference on Data Engineering, Feb. 23-27, 1998, pp. 392-401.

(56) References Cited

OTHER PUBLICATIONS

Huhtala et al., "TANE: An Efficient Algorithm for Discovering Functional and Approximate Dependencies", The Computer Journal, vol. 42, No. 2 (1999).
IBM "Profiling: Take the First Step Toward Assuring Data Quality," white paper, GC-18-9728-00, Dec. 2005.
International Search Report & Written Opinion, PCT/US2012/022905, May 2, 2012, 12 pages.
Jaedicke, et al., On Parallel Processing of Aggregate and Scalar Functions in Object-Relational DBMS, XP-002313223, pp. 379-389 (1998).
Jahnke et al.. "Adaptive Tool Support for Database Reverse Engineering." AG-Softwaretechnik, Universität Paderborn, Germany (19990, 278-282.
Johnson, T et al., "Comparing Massive High-Dimensional Data Sets," Proceedings of the 4th International Conference on Knowledge Discovery and Data Mining (KDD 98), Aug. 27-31, 1998, pp. 229-233.
Kandel et al. "Profiler: Integrated Statistical Analysis and Visualization for Data Quality Assessment" *AVI '12 Proceedings of the International Working Conference on Advanced Visual Interfaces*, pp. 1-8, May 2012.
Kivinen, J and H. Mannila, "Approximate Inference of Functional Dependencies from Relations," Theoretical Computer Science, vol. 149, 1995, pp. 129-149.
Kouris I N et al. "Using Information Retrieval Techniques for Supporting Data Mining" *Data & Knowledge Engineering, Elsevier BC, NL*, vol. 52, No. 3, Mar. 2005, pp. 353-383.
Lee, Kyong-Ha et al., "Bitmap Indexes for Relational XML Twig Query Processing," OIKM '09, Nov. 2-6, 2009, 10 pages.
Lemire et al. "Sorting Improves Word-Aligned Bitmap Indexes" *Data & Knowledge Engineering*, Dec. 2009, pp. 1-43.
Li et al., "A Practical External Sort for Shared Disk MPPs", http://www.thearling.com/text/sc93/sc93.
Lopes, S. et al., "Efficient Discovery of Functional Dependencies and Armstrong Relations," Proceedings of the 7th International Conference on Extending Database Technology (EDBT 2000), LNCS 1777, Mar. 27-31, 2000, pp. 350-364.
Mannila, Heikki, "Theoretical Frameworks for Data Mining," Jan. 2000, SIGKDD Explorations, vol. 1, No. 2, pp. 30-32.
Milne, Robert et al., "Predicting Paper Making Defects On-line Using Data Mining," Jul. 24, 1998, Knowledge-Based Systems, vol. 11, pp. 331-338.
Munakata, Koichi, "Integration of Distributed Heterogeneous Information Sources," with English Translation. Systems, Control and Information, Japan, The Institute of Systems, Control and Information Engineers, Dec. 15, 1996, vol. 40, No. 12, pp. 514-521.
Notification of Reason(s) for Refusal in Japanese Patent Application No. 2006-526986, mailed Oct. 13, 2010, 3 pages.
Novelli, N. et al., "FUN: An Efficient Algorithm for Mining Functional and Embedded Dependencies," Proceedings of the 8th International Conference on Database Theory (ICDT 2001), LNCS 1973, Jan. 4-6, 2001, pp. 189-203.
Office Action issued in Japanese Application No. 2010-153799, English Translation included, mailed May 8, 2012, 6 pages.
Office Action issued in Japanese Application No. 2010-153800, English Translation included, mailed May 8, 2012, 5 pages.
Olson, "Know Your Data: Data Profiling Solutions for Today's Hot Projects", XP-002313222, p. 1-4, published in DM Review, printed from DMReview.com (Mar. 2000).
Petit et al.. "Towards the Reverse Engineering of Denormalizes Relational Databases." Laboratoire d'Ingénierie des Systèmes d'Information, Lyon (1996), 218-227.
Rahm, et al., "Data Cleaning: Problems and Current Approaches", XP-002284896 (2000).
Summons to attend oral proceedings pursuant to Rule 115(a) EPC in EP application No. 04784113.5, dated Jul. 30, 2010, 8 pages.
Wyss et al.. "FastFDs: A Heuristic-Driven, Depth-First Algorithm for Mining Functional Dependencies from Relation Instances." (Extended Abstract) Computer Science Department, Indiana University XP-002333906 101-110.
Yan, Men in, et al., "Algorithm for discovering multivalued dependencies," 2001, ACM Proceedings of the 10th International Conference on Information and Knowledge Management, pp. 556-558.
Yao, H. et al., "FD_Mine: Discovering Functional Dependencies in a Database Using Equivalences," University of Regina, Department of Computer Science, Technical Report TR 2002-04, Aug. 2002.
Yao, H. et al., "FD_Mine: Discovering Functional Dependencies in a Database Using Equivalencies," Proceedings of the 2nd IEEE International Conference on Data Mining, Dec. 9-12, 2002, pp. 729-732.
Yao, Hong et al., "Mining functional dependencies from data," Sep. 15, 2007, Springer Science-Business Media, Data Mining and Knowledge Discovery, vol. 16, No. 2, pp. 197-219.
Yoon, Jong P., et al., "BitCube: A Three-Dimensional Bitmap Indexing for XML Documents," Journal of Intelligent Information Systems, 2001, 17:2/3, pp. 241-254.
Office Action issued in Japanese Application No. 2006-526986, English Translation included, mailed Nov. 22, 2012, 61 pages.
Japanese Office Action, application No. 2010-153799, mailed Feb. 12, 2013, 4 pages.
International Search Report & Written Opinion, PCTUS2015/011518, May 12, 2015, (14 pages).
Naumann, Felix "Data Profiling Revisited," SIGMOD Record, vol. 42, No. 4, pp. 40-49 (2014).
Lynch, C. "Canonicalization: a fundamental tool to facilitate preservation and management of digital information," D-Lib Magazine, vol. 5, No. 9, pp. 1-6 (1999).
International Search Report & Written Opinion, PCT/US2015/016517, May 18, 2015, (17 pages).
English Translation of Notification of Reasons for Refusal, Japanese Application No. 2013-551372, mailed Oct. 27, 2015 (3 pages).
Olsen, Jack E. Data Profiling Technology, Chapters 7 and 8) (23 pages) Jan. 2003.
Mobasher, "Data Mining for Web Personalization", The Adaptive Web; LNCS 4321, pp. 90-135, 2007.
Gauch et al., "User Profiles for Personalized Information Access", The Adaptive Web, LNCS 4321, pp. 54-89, 2007.

GENERATING DATA PATTERN INFORMATION

CROSS-REFERENCE TO RELATED APPLICATIONS

This application is a continuation of U.S. application Ser. No. 13/360,230, filed on, Jan. 27, 2012, which claims priority to U.S. Application Ser. No. 61/437,361, filed on Jan. 28, 2011, each of which is incorporated herein by reference.

BACKGROUND

This description relates to generating data pattern information.

In a database system, data can be stored in individually accessible units or "records" in any of a variety of formats. Each record may correspond to a logical entity such as a credit card transaction and typically have an associated primary key used to uniquely identify the record. The record can include multiple values associated with respective fields of a record format. The records can be stored within one or more files (e.g., flat files or structured data files such as XML files). In compressed database systems individual records or values within records may be compressed when stored and decompressed when accessed to reduce the storage requirements of the system.

SUMMARY

In one aspect, in general, a method includes: storing, in a data storage system, at least one dataset including a plurality of records; and processing, in a data processing system coupled to the data storage system, the plurality of records to produce codes representing data patterns in the records, the processing including: for each of multiple records in the plurality of records, associating with the record a code encoding one or more elements, wherein each element represents a state or property of a corresponding field or combination of fields as one of a set of element values, and, for at least one element of at least a first code, the number of element values in the set is smaller than the total number of data values that occur in the corresponding field or combination of fields over all of the plurality of records in the dataset.

Aspects can include one or more of the following features.

For at least one element of the first code, at least two element values in the set represent a state of a field as populated or not populated, respectively.

The state of not populated includes one of a null state, an absent state, or an empty state.

The null state includes a state of the field having a predetermined value.

The predetermined value includes one or more space characters.

The absent state includes the field being missing in a record.

The empty state includes the field having no corresponding data value.

For at least one element of the first code, at least two element values in the set represent a data value occurring in a field being valid or not valid according to a validation rule associated with the field.

The validation rule defines valid values based at least on part on a data type of the data value.

The validation rule defines valid values at least in part by reference to a list of enumerated values.

For at least one element of the first code, one or more element values in the set represent a degree to which a data value occurring in a first field matches a target data value.

The target data value is a data value occurring in a second field.

At least three element values in the set represent the degree to which the data value occurring in the first field matches the target data value as a mismatch, an exact match, or a fuzzy match, respectively.

For at least one element of the first code, at least one element value in the set encodes a data value computed from one or more values occurring in a field or combination of fields of a first record and one or more values occurring in a field or combination of fields of a set of one or more records including at least a second record different from the first record.

The first record is in a first dataset and the second record is in a second dataset different from the first dataset.

For at least one element of at least a second code, at least one element value in the set represents a predetermined data value occurring in a field.

The number of element values in the set of element values for the element of the second code is equal to the total number of data values that occur in the corresponding field or combination of fields over all of the plurality of records in the dataset.

In another aspect, in general, a computer-readable storage medium stores a computer program, the computer program including instructions for causing a computer system to: store, in a data storage system, at least one dataset including a plurality of records; and process, in at least one processor of the computer system coupled to the data storage system, the plurality of records to produce codes representing data patterns in the records, the processing including: for each of multiple records in the plurality of records, associating with the record a code encoding one or more elements, wherein each element represents a state or property of a corresponding field or combination of fields as one of a set of element values, and, for at least one element of at least a first code, the number of element values in the set is smaller than the total number of data values that occur in the corresponding field or combination of fields over all of the plurality of records in the dataset.

In another aspect, in general, a system includes: a data storage system configured to store at least one dataset including a plurality of records; and a data processing system, coupled to the data storage system, configured to process the plurality of records to produce codes representing data patterns in the records, the processing including: for each of multiple records in the plurality of records, associating with the record a code encoding one or more elements, wherein each element represents a state or property of a corresponding field or combination of fields as one of a set of element values, and, for at least one element of at least a first code, the number of element values in the set is smaller than the total number of data values that occur in the corresponding field or combination of fields over all of the plurality of records in the dataset.

In another aspect, in general, a system includes: means for storing at least one dataset including a plurality of records; and means for processing the plurality of records to produce codes representing data patterns in the records, the processing including: for each of multiple records in the plurality of records, associating with the record a code encoding one or more elements, wherein each element represents a state or property of a corresponding field or combination of fields as one of a set of element values, and, for at least one element of at least a first code, the number of element values in the set is smaller than the total number of data values that occur in the corresponding field or combination of fields over all of the plurality of records in the dataset.

In another aspect, in general, a method includes: storing, in a data storage system, at least one dataset including a plurality of records; and processing, in a data processing system coupled to the data storage system, the plurality of records to produce representations of data patterns in the records, the processing including: analyzing one or more states or properties of fields or combinations of fields of the plurality of records, and generating codes to denote the one or more properties as representations of data patterns in the records.

In another aspect, in general, a method includes: storing, in a data storage system, at least one dataset including a plurality of records; and processing, in a data processing system coupled to the data storage system, the plurality of records to produce representations of data patterns in the records, the processing including: for each record in the plurality of records, specifying a code encoding one or more data elements corresponding to fields or combinations of fields of the record, wherein one or more data elements represent whether a corresponding field is populated.

Aspects can include one or more of the following advantages.

When a dataset is analyzed for data quality, a field by field count is often computed stating in how many records the field is absent (not present in the record), is empty (no characters), is blank (one or more space characters), is null (contains a particular value associated with NULL), is populated (present and not empty or blank), or is valid or invalid according to a set of validation rules (e.g., according to datatype or by reference to a list of enumerated values). A state of population of a field or combination of fields may be formed from one or more of these conditions or combinations of them and more generally is some association of the values in a field or combination of fields to a code. The collection of states of population for a set of selected fields or combinations of fields in a record can be encoded in a data pattern code that summarizes the state of population of the selected fields or combination of fields collectively. Data pattern codes can also be used to indicate other properties in addition to or instead of a state of population. The number of records having each data pattern code can be computed. The set of derived data pattern codes reflects the diversity of population in the dataset and the counts associated with each pattern indicates the prevalence of that pattern in the dataset.

The data pattern code can be used to measure the data quality of a dataset. Some data pattern codes may be deemed valid (the pattern of population is acceptable) while others not. For example, certain fields may be mandatory, that is, they are required to be present and populated in every record. A data pattern code can be computed which has the value 1 if all the mandatory fields are populated and 0 if any are not populated. The fraction of records with data pattern code 0 indicates the fraction of records in the dataset which have a data quality issue because some mandatory field is not populated. A more refined data pattern code would allow the identification and quantification of which mandatory fields are not populated.

In some datasets, some fields are conditionally mandatory, that is, if one field is present or has a particular value, then another field must be present. Data pattern codes can be constructed to verify this when the condition is known or to infer it from the distribution of data pattern codes when the condition is not known. This latter is valuable because it enables the detection of hidden business rules by seeking correlation between fields within the data pattern codes. For example, a transaction dataset may contain a tax field which is only populated for stores in locations where tax is collected. A correlation between population of the tax field and certain store ids identified from a preponderance of joint population of the fields in the data will reveal this. When the correlation is violated, it is evidence of a data quality issue.

Data pattern codes can be used to recognize not just the population of fields but also to detect and identify different kinds of invalidity (that is, data that is inappropriate for the field in which it is held, e.g. a non-numeric character in a numeric field). This is useful for quantifying data quality and is also useful for testing applications. A test dataset can be constructed by extracting a sample of records from source data (e.g., from the actual production data the application will eventually process) with each extant data pattern code. For data pattern codes based on validity, many of the codes may identify records containing invalid data. The associated records can be used to test the robustness of an application to bad data (that really occurs). This allows testing that may otherwise not be possible until the application is deployed in production. It is often cheaper to fix problems if they are detected earlier in the software development lifecycle.

Data pattern codes may reflect other assessments (e.g., other than population or validity). For example, the state of a field or combination of fields may be notable in some way, where the state is determined by a computation involving the value in the field or a combination of fields of a given record with values of fields in other records in the same dataset or in records in other datasets. For example, the value of a transaction amount field might be deemed notable in the context of a group of records in a dataset if it is more than two standard deviations from the mean for that group. Similarly, it might be notable relative to an historical mean stored in or computed from records outside of the dataset.

In another example, in a fuzzy match application, a score may be computed that measures the quality of the match of a given record with other records in a group or cluster. One element of a data pattern code may be associated with match quality scores in banded ranges to indicate a record is an Exact Match, a Fuzzy Match (score above a match threshold but not exact), etc. A data pattern code constructed from this element in conjunction with similar elements measuring the quality of match for elements of the record like name or address can be used to classify records into sets for appropriate handling or analysis (e.g., "fuzzy record match, exact name, fuzzy address, no postcode").

Data pattern codes can also be used to analyze the output of an application under construction. Expected validity rules and correlations among fields can be checked programmatically with data pattern codes. Examining sample extracts of records for each data pattern code associated with the output of an application can reveal unexpected bugs. If the data pattern codes record population and validity information from different stages of the application, by comparing data pattern codes from good and bad outcomes, bad outcomes can be analyzed and traced back to their origin.

Sample extracts also provide test cases which can be used as the basis for constructing new inputs for successive runs. This use is potentially important in applications where repeated execution is required as part of testing. One instance where repeated execution is used is when tuning parameters to achieve a desired result. For example, in a fuzzy match application where names and addresses are compared for similarity, there is often a threshold below which a score characterizing a degree of match between a pair of names and addresses are not considered a match. The application may need to be run many times as various parameters controlling the match decision are adjusted so that cases which should match do so. Different patterns of population (e.g., no middle name, only a first initial, no house number, etc.) affect the business rules involved in the match decision process. Data pattern codes, constructed by combining population patterns with codes reflecting the quality of match for different scoring fields ("exact name", "fuzzy address", etc.), can be used to isolate test cases which reflect the different cases, and this can be invaluable to expediting the tuning process.

Some application interfaces standardize data from disparate sources into a common record format for downstream processing. Typically not all fields will be populated by every source. A data pattern code can identify which combinations of fields occur in the source data. This can be used in some cases to infer the origin of the data when it is not known. By identifying correlations between fields in the data pattern codes, hidden business rules can be inferred, e.g. that one field is conditionally mandatory on another. For example, if data from several European countries has been combined into a single dataset, it may be that certain fields are only populated if the data comes from a German source. This can be inferred from analysis of the underlying data in light of the data pattern codes and later confirmed by the business. The absence of data in those fields in records from other countries is then explained and is not a data quality issue.

In some situations, it can be helpful to undo a common record format to return it to a conditional form consisting of only (or mostly) populated fields. This may be necessary if source-specific processing is required despite the data arriving in uniform format. The data pattern code can assist in identifying the classes of records present in the source data [that is, the sets of fields that are (almost) always populated together], serving as the condition in the conditional record format, and then facilitating the decomposition of the source dataset into the reduced record formats.

If a uniformizing record format describes the data source for an application, it can be difficult to obtain or construct a representative set of test cases which span the diversity of input cases the application needs to be able to handle. Given access to the actual (production) source data the application will ultimately handle, data pattern codes can be constructed for each source record, and a (small) set of records representative of each pattern can be extracted. These records can be obfuscated, if necessary, to be used in a test environment, but they constitute a comprehensive set of test cases of the production data at that point in time (the cases can always change over time). This set of records can then be used for code coverage analysis and edge-case stress testing of the application (that is, testing for behavior under rarely seen data combinations).

Many legacy mainframe datasets are described by COBOL and contain COBOL REDEFINES. A REDEFINES statement is used to save space by reusing the same set of byte positions to hold data in different record formats (usually for a subrecord) within the same dataset. For example, in one record, the bytes might contain customer information like a personal name and customer identifier while in another record the bytes might contain invoice data containing quantity and price information for a purchased item. Sometimes another field in the record identifies which instance of the REDEFINE is intended for a given record, but the knowledge of which field this is may be lost or unavailable (e.g., contained in application code). Sometimes something external to the record format (e.g., the filename, a commandline argument to the processing application, or something else external the application code has access to) identifies which REDEFINE to use for an entire dataset. Sometimes the contents of the bytes must be inspected to determine which REDEFINE is intended. These cases are exemplary not exhaustive. A data pattern code constructed from the contents of all of the REDEFINE fields taken together, particularly considering validity of the fields based on their expected contents (e.g., decimals cannot contain alphabetic characters, string data will not contain arbitrary binary characters, a country code must be in a particular reference table, etc), can be used to infer which REDEFINEs are correct for a given record (there may be more than one). This data pattern code can be added to the record and used to convert to a conditional record format which is more amenable for processing by non-COBOL applications. Similar considerations apply to union data structures and other "variant records" in other languages.

XML documents are described by an associated XML schema which often contains a superset of the fields present in any particular document (or exemplar). This is particularly true in industry standards like ISO20022 for financial transactions which are designed to subsume a variety of legacy formats. These industry standard schemas are often large and complex and only a small fraction of the possible elements (fields) are populated in a given document. When working with a collection of documents in such a schema, it is useful to know which elements are in use and what the distribution of elements is across the collection of documents. This can be answered by constructing a data pattern code (or perhaps a set of data pattern codes) for the document. This is particularly useful when designing new applications because business rules do not have to be written for those elements in the standard that do not appear in the source data, thereby saving much time and resource.

Some organizations propose to store their legacy data in industry standard formats like ISO20022 as it puts data from different legacy formats, perhaps customized or extended, into a common data structure. A challenge when working with data in the common format is that not all sources will have populated the same collection of fields within the schema. Constructing a data pattern code from a collection of exemplar documents will show which fields are in use and can be used to classify the documents for downstream handling. In some cases, the nature of the upstream legacy source can be inferred from uncommon populated fields, and this may aid in developing business rules for handling those fields.

Another feature of XML documents is that they organize data into elements which may contain other elements. Some of these elements will be mandatory—they must be present in any document—while others will be optional. Still other elements are conditionally mandatory: if one element is present, another must be as well. The schema often contains this information, but in a form which is not always amenable to use by other applications. A table can be constructed from the schema which identifies valid data pattern codes, perhaps by identifying which combination of elements must be present and which not. An XML document can be validated for conformance with the XML schema by comparing data pattern codes constructed from exemplar documents with this table of valid data pattern codes.

Some XML elements are intended to segregate information with different purposes. For example, there might be a tag for data identifying a creditor by name and address and another tag for details of a financial transaction. These different elements may be destined for separate processing. As not every document will have every element present, a data pattern code can be used to identify which elements are present in a given document, and this in turn can be used to decompose the document and to route the different elements of the document to appropriate processing.

Other features and advantages of the invention will become apparent from the following description, and from the claims.

DESCRIPTION

Figure 1:
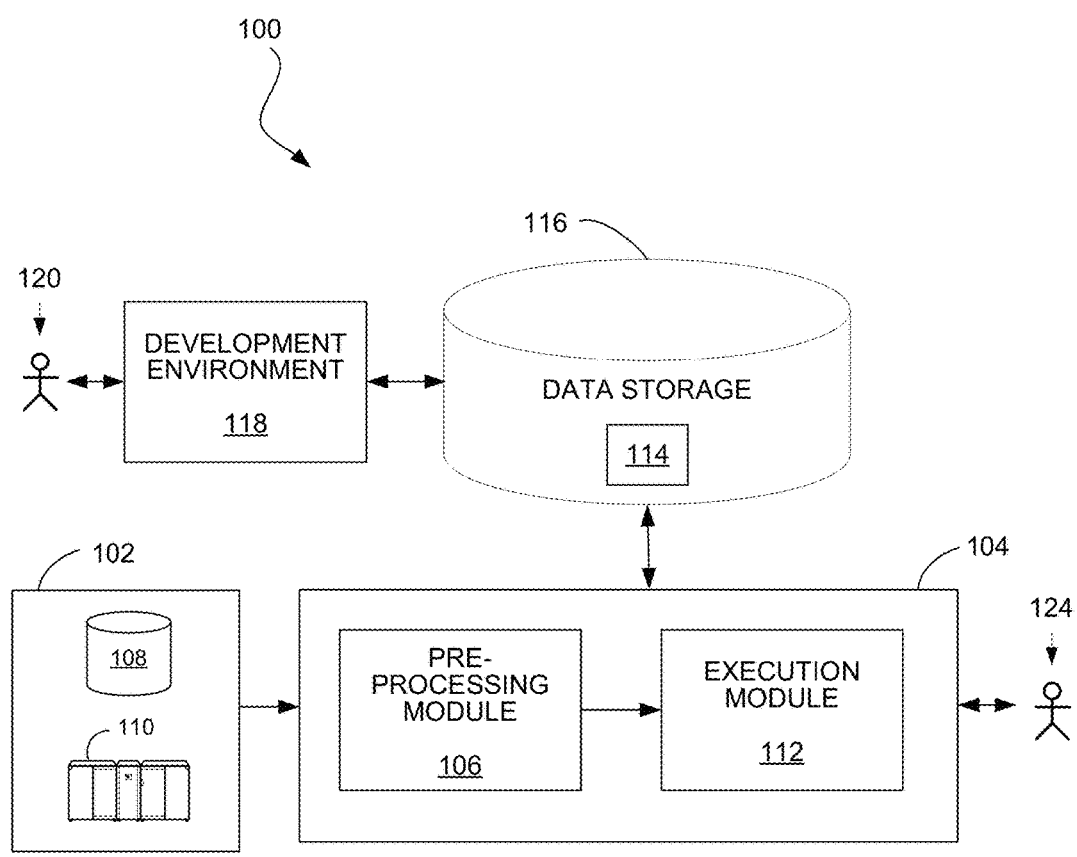
FIG. 1 is a block diagram of a system for performing data pattern analysis.

FIG. 1 shows an exemplary data processing system 100 in which the data pattern analysis techniques can be used. The system 100 includes a data source 102 that may include one or more sources of data such as storage devices or connections to online data streams, each of which may store data in any of a variety of storage formats (e.g., database tables, spreadsheet files, flat text files, or a native format used by a mainframe). An execution environment 104 includes a pre-processing module 106 and an execution module 112. In some implementations, the pre-processing module 106 receives one or more datasets from the data source 102 and performs data integrity checks on the data in the datasets. For example, the pre-processing module 106 may screen the datasets for records containing out-of-range values, impossible values, etc. The execution module 112 analyzes the datasets for patterns including using the pattern information for diagnostics and other high level data processing. The execution environment 104 may be hosted on one or more general-purpose computers under the control of a suitable operating system, such as the UNIX operating system. For example, the execution environment 104 can include a multiple-node parallel computing environment including a configuration of computer systems using multiple central processing units (CPUs), either local (e.g., multiprocessor systems such as SMP computers), or locally distributed (e.g., multiple processors coupled as clusters or MPPs), or remotely, or remotely distributed (e.g., multiple processors coupled via a local area network (LAN) and/or wide-area network (WAN)), or any combination thereof.

Storage devices providing the data source 102 may be local to the execution environment 104, for example, being stored on a storage medium connected to a computer running the execution environment 104 (e.g., hard drive 108), or may be remote to the execution environment 104, for example, being hosted on a remote system (e.g., mainframe 110) in communication with a computer running the execution environment 104, over a remote connection.

The execution module 112 processes datasets from the data source 102 and optionally uses the results from the pre-processing module 106 to generate representations of the patterns in the datasets, e.g., encoded in one or more codes 114, stored in a data storage system 116 accessible the execution environment 104. The codes 114 may be stored along with the data in the datasets within the data source 102 or in another location. The data storage system 116 is also accessible to a development environment 118 in which a developer 120 is able to view and manage the performances of the data pattern analysis.

The development environment 118 is, in some implementations, a system for developing applications as dataflow graphs that include vertices (representing components or datasets) connected by directed links (representing flows of work elements) between the vertices. For example, such an environment is described in more detail in U.S. Publication No. 2007/0011668, entitled "Managing Parameters for Graph-Based Applications," incorporated herein by reference. A system for executing such graph-based computations is described in U.S. Pat. No. 5,566,072, EXECUTING COMPUTATIONS EXPRESSED AS GRAPHS, incorporated herein by reference. Dataflow graphs made in accordance with this system provide methods for getting information into and out of individual processes represented by graph components, for moving information between the processes, and for defining a running order for the processes. This system includes algorithms that choose interprocess communication methods (for example, communication paths according to the links of the graph can use TCP/IP or UNIX domain sockets, or use shared memory to pass data between the processes).

The pre-processing module 106 can receive data in the form of "datasets" from a variety of types of systems including different forms of database systems. The datasets may be organized as records having values for respective fields (also called "attributes" or "columns"), including possibly NULL values. When first reading data from a data source, the pre-processing module 106 typically starts with some initial format information about records in that data source. In some circumstances, the record structure of the data source may not be known initially and may instead be determined after analysis of the data source. The initial information about records can include the number of bits that represent a distinct value, the order of fields within a record, and the type of value (e.g., string, signed/unsigned integer) represented by the bits. Subsequently, the pre-processing module 106 can perform data integrity analysis on the records to ensure for example, that the values corresponding to the fields are within the expected range and expected data type.

Once the pre-processing steps are completed, the execution module 112 performs data pattern analysis. More generally, a data record can have multiple properties related to one or more fields and/or a combination of fields for the record (e.g., fields defined by a record format or schema as potentially being present in the record). The properties can correspond to each field or combination of fields for the record and can include data value type, data value length, and/or data value. In some implementations, the values corresponding to fields in a data record can be collectively referred to as a population of the record. In general, the fields for a record are not necessarily all populated. For example, data records may or may not have values corresponding to all of the fields that are present in an individual record. Additionally, some fields, known or declared to be associated with the record, may not be present and may be referred to as absent fields. Thus there may be various reasons why a field is indicated as "not populated." Some fields may be absent from a particular record, some fields may be present but may be empty or may contain a "NULL" value (a value predetermined to indicate that the field is not populated, such as a string of one or more space characters). Fields that are present and include non-NULL values are "populated". In some implementations, the absence of fields or values corresponding to fields of a record may indicate that the record is incomplete in some way, which may be a data quality problem. In some implementations, the lack of fields or values may simply signal the irrelevance of the particular fields for the given record.

A pattern of a record's population can be ascertained by analyzing the fields of the record. Representations of data patterns in the records can include, for example, formulating a data pattern code having data elements where the values of the elements correspond to one or more states or properties of corresponding fields or combinations of fields of the records. The element values can be selected from a predetermined set of element values. The number of element values in the set can be smaller than a total number of data values that occur in a corresponding field over the records in a dataset. For example, the data pattern can be a bitmap in which the elements are bits representing states or properties of the fields in records. For example, a data pattern code formulation can include a bitmap having one or more bits set to denote a state or property of a field as follows: 0 corresponds to a field state of "empty" or "absent" and 1 corresponds to a field state of "not empty" and "not absent". An alternative bitmap can be as follows: 0 corresponds to field state of "empty" (e.g., no value) or "NULL" (e.g., the field has a predetermined "NULL" value such as one or more space characters), 1 corresponds to a field state or property of "absent" (e.g., the field is not present in the record), and 2 can correspond to a field state of "populated" (e.g., the field has a non-NULL value).

One or more fields or combinations of fields of the plurality of records are analyzed to ascertain patterns among various states or properties of the fields. For example, if the analysis determines whether the fields are populated or not, possible pattern information for a particular record may include an array of information representing whether the fields are populated or not in that particular record. In this manner, a data pattern code is associated with a record to indicate the data pattern corresponding to the record.

In some implementations, a user may wish to know the fraction of records having a certain value for a field. By way of example, a record may have the field "apt_num", which refers to a fragment of an address body where a unit or apartment number can be expected. A user interested in knowing what fraction of records is identified as having an apartment can find out this information by a quick view of the pattern information. The pattern information can also provide insights into possible correlations between fields of the records. For example, records having addresses that are indicated as not having an apartment or unit number may also have their home owner fields set to "Yes" indicating that the record belongs to an individual is a home owner.

In some implementations, a record may be considered incomplete if a value in a mandatory field is missing. For example, in a record of a bank customer, the surname of the customer may be a mandatory field. As such, if a surname value in the surname field of the customer record is not present, the record should be deemed incomplete. Conversely, if a middle name value of the customer record is not present, the record may not be incomplete as a middle name can be deemed an optional value. In such situations, the pattern of a bank customer's record can be determined and a data pattern code assigned to the record. Once the execution module 112 has determined the data pattern code for the particular record, further data that is read from the data source 102 can be analyzed in light of the code. Along these lines, one or more rules can be written to flag data records that are missing a surname value in the surname field for error correction. As such, the data pattern code formulation can be used as a diagnostic mechanism to ensure that mandatory fields are populated and also to quantify the population of optional fields.

In some implementations, when the data processing system 100 is in data discovery mode, the data pattern code formulation can be used to distinguish mandatory fields from optional fields. Sometimes, original population rules that provide for which fields are mandatory and which optional may be lost or unavailable. For example, the original rule that provides that a surname field is a mandatory field while a middle name field is an optional field may be unavailable to the system 100. The execution module 112 can analyze the datasets in the data source 102 to establish the pattern of population within the datasets. In this situation, if substantially all the records in a given dataset have their surname fields populated by non-empty values, and only a certain fraction of the records in the dataset have their middle name fields populated, then the system 100 can surmise that the surname field is a mandatory field and the middle name field is an optional field.

Figure 3:
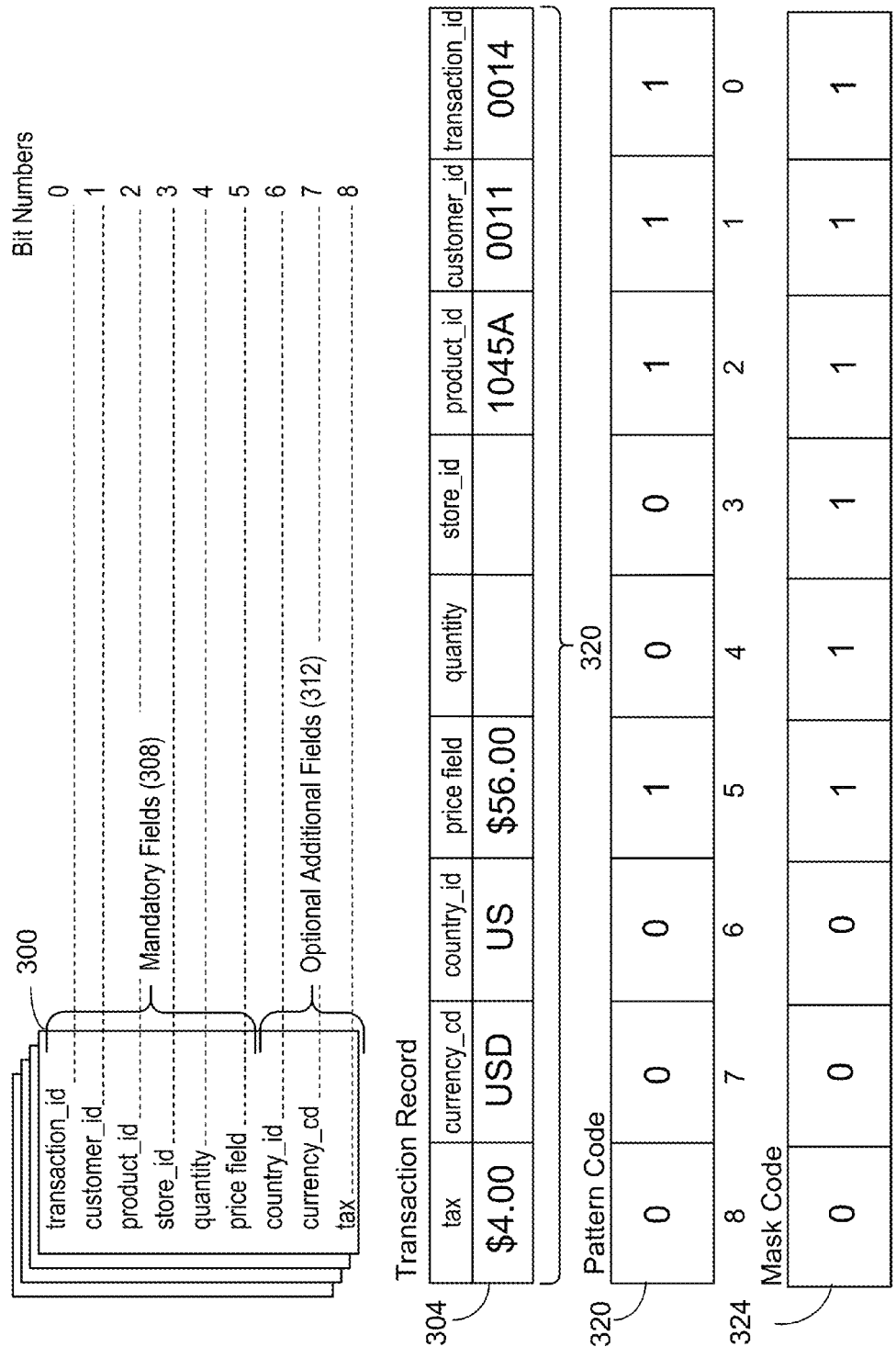
FIG. 3 is a schematic diagram illustrating fields and corresponding codes of records.

As an example, referring now to FIG. 3, consider a "Transactions" dataset 300 in an enterprise data warehouse of a multinational retail organization. The warehouse may record transactions made in stores in several countries. Accordingly, a transaction record 304 corresponding to a transaction in a country can involve a transaction_id field (e.g., a surrogate key identifying the particular transaction), a customer_id field (e.g., a surrogate key linking to another dataset consisting of a master list of customers), a product_id field identifying items that have been purchased (e.g., a surrogate key linking to another dataset consisting of a master list of products), a store_id field (e.g., a surrogate linking to a dataset consisting of a list of stores and their locations), a quantity field, and a price field. These fields may all be deemed mandatory fields 308 (e.g., the fields may not be permitted to be empty). Consequently, if any of these mandatory fields 308 are unpopulated, the quality of the data can be deemed problematic. The dataset can also include additional fields 312, such as, a country_cd field (e.g., a surrogate key identifying the country in which the store is located), currency_cd field (e.g., a surrogate key identifying the currency of the transaction), and a tax field indicating an amount of tax included in the purchase. In some implementations, the additional fields 312 may or may not be populated and the absence of data in such fields may not present a data quality problem.

In the above scenario, the data quality of the Transactions dataset 300 can be analyzed by assigning a data pattern code 316 to each record 304. For example, the data pattern code 316 can reflect which fields 320 of the transaction record 304 are populated and which fields are not populated. Assuming a bitmap code formulation, bits of the bitmap code can be assigned to corresponding fields of a transaction record as follows: transaction_id (bit 0), customer_id (bit 1), product_id (bit 2), store_id (bit 3), quantity (bit 4), price (bit 5), country_cd (bit 6), currency_cd (bit 7), and tax (bit 8). If a field of the transaction record is populated, the corresponding bit is set to 1 otherwise the bit is set to 0. Generalizing, in decimal notation, if for example, bit "k" is set to 1, then a value of $2^k$ is added to the bitmap code. For example, if the transaction_id, customer_id, product_id, price and tax were populated, the data pattern code would be 151 (bits 0, 1, 2, 5 and 8 set correspond to 1+2+4+32+256=295).

In some implementations, a mask code 324 can be implemented corresponding to the mandatory and additional fields 308, 312. The mask code 324 acts as filter that can selectively include or exclude fields or field values of the record 304. As described above, the first six fields of the example transaction record are mandatory fields 308 and the next three fields are additional fields 312. As such, the mask code 324 can be formulated to indicate the mandatory and additional fields 308, 312 as follows: [0 0 0 1 1 1 1 1 1] (in decimal notation, the mask code is 63). A bitwise AND operation can be computed between the bitmap code 320 and the mask code. If the result of the bitwise AND is anything other than 63, then one of the mandatory fields 308 is unpopulated. For example, (63 & 295)=39, which indicates that bits 0, 1, 2 and 5 are set, and thus the store_id and quantity fields are unpopulated. Consequently, this situation can be flagged as a data quality issue.

In some scenarios, heterogeneous datasets (e.g., datasets in which records may accept values in different data record formats) may have records that include separate fields to identify the record type. As such, data formats of the population for the records can be made conditional on the record type. However, in certain other datasets having conditionally mandatory fields (i.e., fields that are mandatory only when certain data conditions are satisfied) there may be an implied heterogeneity with no explicit field holding information about the record type. In such situations, the data pattern code formulation can be used to determine the underlying collection of record formats and to verify the integrity of datasets having conditionally mandatory fields. A developer or analyst may use the data pattern code formulation to categorize such conditionally mandatory records. The use of the data pattern code formulation in this situation as a surrogate record type may be analogized to a surrogate key (i.e., a system generated key having no business/real world meaning) that may be used in place of a natural key.

By way of example, in the context of the Transactions dataset 300 (FIG. 3) described above, data may be captured separately within each store, combined into a single dataset for each country, and then loaded into the Transactions dataset 300 in the enterprise data warehouse. Consider an example scenario where transaction datasets in the United States do not have country or currency fields (i.e., bit numbers 6 and 7). The US transaction record format can be extended to include the two new fields, while to maintain consistency with legacy applications, the country and currency fields are unpopulated for US transactions. These fields can be deemed mandatory for non-US transaction records. As such, any situation where these data values are not present in these fields can be flagged as a data quality problem. In this regard, the fields are deemed mandatory subject to the condition that the records are non-US transaction records. Similarly the tax field (bit 8) can be deemed mandatory if tax was collected in a region during a transaction. Again, a situation where tax was collected but the tax field is unpopulated can be flagged as a data quality problem, and thus, the tax field can be deemed mandatory subject to the condition that the records are in a region where tax was collected.

Conditional data patterns can be analyzed in a manner similar to mandatory data patterns. In the present scenario, US transaction records are expected to have unpopulated country_cd and currency_cd (bits 6 and 7) fields while these fields are expected to be populated for non-US transaction records. Without explicitly checking a location of a store (which, in some situations, can require accessing a Store dataset), the correlation of the patterns of country_cd and currency_cd fields can be verified by checking that bits 6 and 7 are either both set to 1 or both set to 0.

In some implementations, the existence of such a correlation can be inferred from the distribution of data pattern codes. The Transactions dataset 300 can be rolled up to the data pattern code such that it is possible to count the number of records having each code. This way the number of records having both bits 6 and 7 set or not can be determined. In some implementations, it can be useful to extract a sample of records having data pattern codes for the purpose of looking for explanations for the patterns. In this scenario, after examining a suitable sample of records, the absence of the US country code from the country_cd field would likely stand out as well as the corresponding absence of the US dollar currency code from the currency_cd field. Accordingly, the population of currency_cd field can be regarded as being conditionally mandatory on the population of the country_cd field. In this manner, the use of the data pattern code formulation can simplify the process of looking for "hidden" rules.

In some data processing applications, special record formats may be used to standardize or make uniform data from disparate sources before processing through a common framework. In such applications, to avoid losing information, the "uniformizing" record format includes a superset of the fields from different sources. The uniformizing record format can be generated by analyzing data patterns from several different sources. For example, in some implementations, a first set of fields can hold data that is common to many sources while a second, different set of fields may be uniquely associated to a particular source or subset of sources. By way of example, a date field in a record from a first source may be in a "DD/MM/YYYY" format, which a data field in a second, different record from a second source may be in a "DD, Month, Year" format. In some sources, only a day and a month may be available, which in other sources the day, month, and year values may be in separate fields. The uniformizing record format can thus be derived from a combination of records types from the variety of sources. Subsequently, the uniformizing record can be populated by data from records belonging to different sources.

In some implementations, in order to determine whether the uniformizing record has been populated properly, one or more business rules specifying mandatory and conditional population can be used to associate expected data patterns with the output of test scenarios. These expected outcomes can then be compared to the actual results for validation. For example, once the execution module 112 has produced a uniformizing record format, a variety of data sources can be used to populate the uniformizing record. Then, the business rules specifying mandatory and conditional population can be used to determine if the fields have been populated correctly.

Differing record structures can be involved in data warehousing applications when data from different sources are combined into a common format, for example, when legacy data from different companies in different countries are combined after a corporate merger. Along these lines, in the Transaction dataset 300 (FIG. 3) there may be additional fields which are country-specific. For example, in some countries there can be a package_id field which is used to indicate when an item was bought as part of a multipack (e.g., similar to a "six-pack" set of beverages), while in other countries there can be a volume field to indicate a size (e.g., 16 ounces or 400 g) and a unit field to indicate a number of units. The data pattern code 320 can indicate that only certain fields have correlated populations. That is, either the package_id field is populated or the volume and unit fields are both populated, and both only occur for certain disjoint country_cd field values.

In some implementations, a conditional record format can be constructed which describes a dataset in terms of a set of record formats, each of which consists only of populated fields. For example, one reduced record format might have just the package_id as an extra field, another would have volume and unit while yet another might have no additional fields. Such a reduction can be useful when working with complex record formats which combine data from many sources. In some implementations, an investigation of a sample of records in each of the different reduced formats can indicate the source or provide a business reason behind the reduced record format, even when this was not known at the outset.

In some examples, the data pattern code formulation can be used in conjunction with COBOL REDEFINES. In general, the REDEFINES clause allows a same memory area to be described by different data items to save space. As such, a COBOL REDEFINES can specify two or more parsings of a same set of bytes into different fields. In the C-programming language (or similar programming languages) such a construct can be called a union data structure, and similar issues can occur. Which one of two or more REDEFINES is to be used in a given record is sometimes determined by another field in the record, but knowledge of which field this is may be lost or unavailable (e.g., embedded in application code). Alternatively, there may be no field in the record which indicates which REDEFINE to use. Sometimes this information is held external to the record format (e.g., in the filename or somewhere available to the processing application) or sometimes the contents of the REDEFINE may need to be inspected to determine which is the correct one. These examples are meant to be exemplary rather than exhaustive. All of these situations pose potential difficulties for reading the dataset outside of its original context.

A data pattern code computed using all fields of a REDEFINE can infer an appropriate parsing. In an example scenario, a REDEFINE data structure can consist of dissimilar data. For example, if one branch of a REDEFINE contains only alphabetic text fields while another REDEFINE for the same bytes contains decimal fields, the decimal fields would be marked as invalid when the decimal fields contain anything but numerals and a single decimal point. This situation can occur in legacy mainframe data where COBOL REDEFINES are used. A data pattern code formulation based on validity of data in the fields (rather than simple population) can be used to detect the correct parsing. In some implementations, the resulting data pattern code can be used to convert the data structure to a conditional record format in which each alternative REDEFINE format only occurs for an associated data pattern code.

For legacy data, questions regarding which fields are common to many sources and which are specific, or whether there is a correlation among fields which may or may not persist across sources may be answered by consulting the business rules which were used to populate the data. In some scenarios, these rules may be lost or unavailable. For example, any written documentation may be out of date or lost while the rules are still being actively used. In such scenarios, the data pattern code formulation can be used to determine correlations between the fields and also to determine associations between fields and the sources of the records.

In some implementations, correlations among fields in a record can be deduced by performing an aggregation after constructing the data pattern code. For example, in the Transactions dataset 300 (FIG. 3), if the dataset is rolled up to the store_id field, a count of how many records have the tax field populated can be used to determine which stores are in regions having a sales or VAT tax. The determination of which regions take tax can be inferred from the statistics of the data alone as described in detail above.

In some implementations, data can be present in industry standard record formats such as XML, and ISO20022 for financial transactions. For example, some may opt to use ISO20022 as an internal standard because they can populate their legacy data into a common format without having to reengineer existing systems. Also, different legacy sources (including customized or extended legacy formats) can populate fields in common with other sources and some fields unique to the legacy source. In this regard, developers may need to write applications which work with data held in the industry standard. As a complete record format described by the industry standard can be complex and contain extraneous data from the perspective of any one legacy type, developers may choose to discard unpopulated fields. Specifically, an XML schema can define a possible set of fields which may be populated. An XML record (e.g., a document including data formatted according to XML) thus may contain only the fields that are populated for that record.

In a data warehousing situation where data from multiple legacy sources is held together, the data present within the XML records can vary. If a data pattern code is computed for each XML record, the code can enable records using different combinations of fields to be easily separated for independent processing. The kinds of fields populated together can represent qualitatively different kinds of data (e.g. institutional identifying information like BIC codes are distinct from name and address information) and thus are destined for distinct processing. Masking or the creation of multiple data pattern codes can enable these segments of data to be distinguished easily.

Further, in some implementations, some XML tags can be mandatory while others are not. The data pattern code formulation as described above can help analyze the fields without relying on reference to documentation.

In some implementations, the data pattern code formulation can be used to prepare test cases for downstream applications. When input data to an application is assembled from many sources, there can be a concern about whether the application can properly handle the variety of input it might receive. In real world situations, the input data volume to an application can be too great to allow for meaningful testing. To address this situation, in some implementations, a data pattern code can be formulated for the production data, i.e., the input data to the application. A dataset of test records may be created based on the data pattern code, and applied to the application. For example, a small number of records (e.g., a single record or another predetermined number of records) can be selected for each distinct data pattern code. Having been taken from the full production data, this dataset may be deemed to represent a comprehensive set of test cases that the application can be configured to handle properly.

Figure 2:
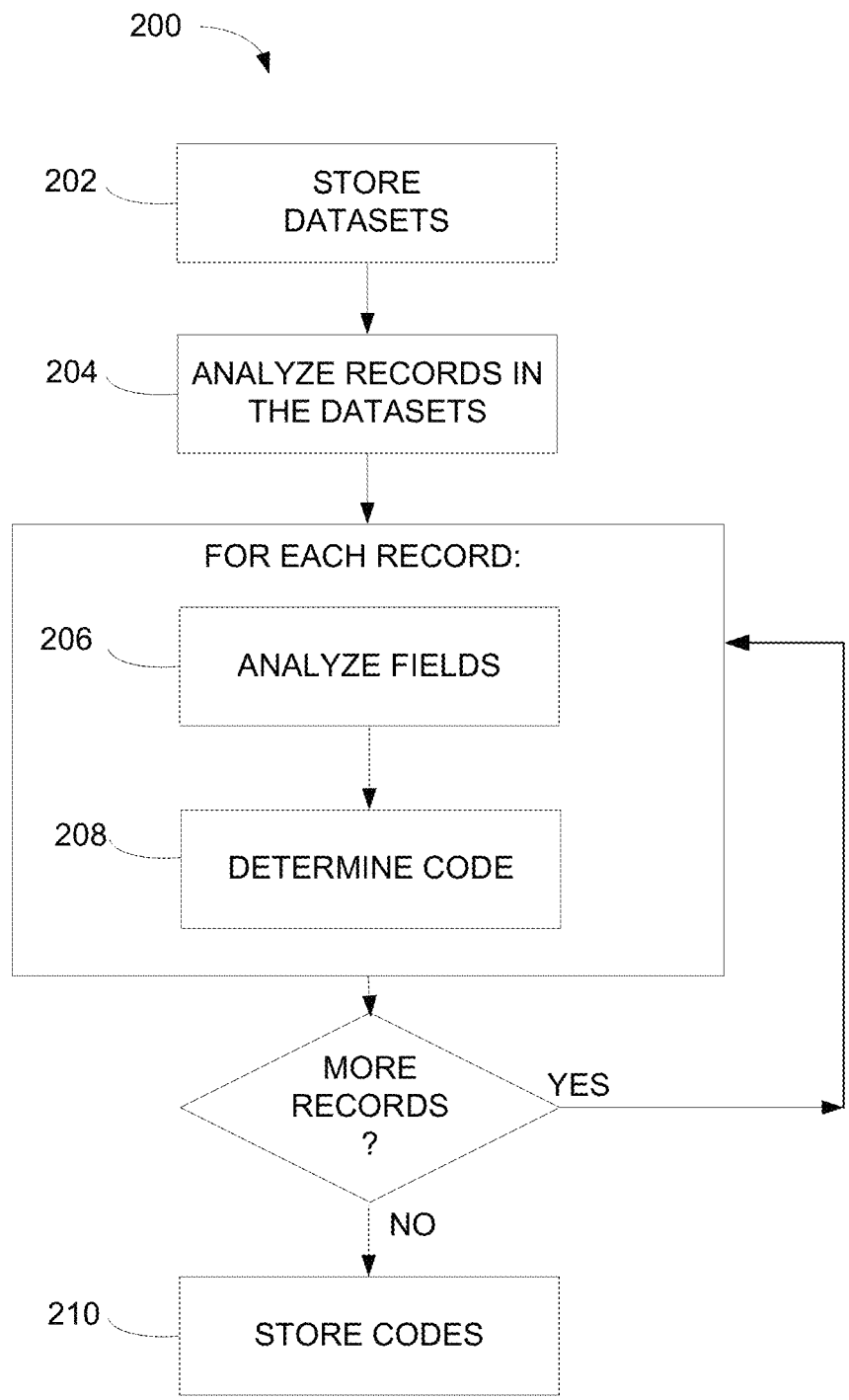
FIG. 2 is a flowchart of an exemplary data pattern analysis procedure.

FIG. 2 shows a flowchart for an exemplary data pattern analysis procedure 200. The procedure includes storing (202) datasets in a data storage system. The datasets can include a plurality of records having values corresponding to multiple fields. The records are analyzed (204) in a data processing system coupled to the data storage system to produce representations of data patterns in the records. The representations of data patterns in the records can include, for example, a data pattern code formulation such as a bitmap having bits representing properties of the fields in records. The processing of the records can include, for each record, analyzing (206) one or more fields or combinations of fields of the plurality of records. The analysis can include, for each record in a dataset, computations involving one or more other records in the dataset or in one or more other datasets. For example, the mean of a numeric field may be computed for a set of records in a dataset and compared with the mean of a set of records taken from a collection of other datasets ("the historic mean") to determine if the present mean is larger than the historic mean by some threshold amount. The analysis can include discovering one or more patterns among fields in the plurality of records. For example, if the relevant state or property includes whether the fields are populated or not, the pattern can be an array of information representing whether the fields are populated or not. In this manner, a data pattern code can be formulated (208) to indicate the data pattern corresponding to the record. After the records are processed, resulting codes can be stored (210) in a manner identifying the records and their corresponding data patterns. As additional records are analyzed, the procedure 200 can be repeated, processing the additional records.

In some implementations, a subroutine can be used in a larger program to receive as argument a record containing a vector of field names and generate a data pattern code. For example, a subroutine can take as argument a record and a rule_type with values such as "blank", "blank_or_NULL", etc. The subroutine can compute a value for each fieldname and constructs a bitmap appropriate to the chosen rule_type. A "blank" rule_type provides a data pattern code that indicates whether a field is blank or populated. As such, the resulting bitmap is binary with a bit set if the field is populated and zero if the field is no populated. A "blank_or_NULL" rule_type provides a data pattern code that indicates whether the field is blank (0), populated (1), or NULL (2), using in this case two bits for each code. A "validity" rule_type can provide a data pattern code that indicates whether a given field is invalid (0) or valid (1). An invalid field can be one which contains bytes or values not permitted for the associated data type. For example, "31 Jun. 1960" is invalid as a date field while "123a" is invalid as a decimal field.

An "expression" rule_type can allow expressions to be supplied for each field and to associate their result with a bit (or set of bit values). For example, some non-nullable fields can be analyzed with a "blank" rule while other nullable fields can be analyzed with a "blank_or_null" rule. Other fields which contain only a small set of enumerated values can have their particular values mapped to a bit value. For example, gender of "M" or "F" could be mapped to 0 or 1 while a transaction_type field of "A", "C" or "P" can be mapped to 0, 1 or 2.

In some implementations, one or more combinations of fields can also be encoded. For example, in an application which is comparing fields for similarity ("fuzzy matching"), a set of match codes can be assigned for the comparison of two fields (typically in two separate records, possibly in separate datasets). For example, given two company names which are being compared, the outcome (e.g., a score quantifying a degree of match) can be marked as "Mismatch" (0), i.e., the company names are not similar according to some predetermined criterion, "Exact match" (1), "Fuzzy match" (2), i.e., the company names are similar but not identical according to some predetermined criterion, "Unpopulated0", i.e., the company name 0 is unpopulated while company name 1 is populated, Unpopulated1" i.e., the company name 1 is unpopulated while company name 0 is unpopulated, and "Unpopulated01", i.e., neither company name is populated. Examples of techniques for fuzzy matching, and clustering based on fuzzy matching, are described in U.S. Patent Publication No. 2009/0182728 A1 entitled "MANAGING AN ARCHIVE FOR APPROXIMATE STRING MATCHING," and U.S. Patent Publication No. 2010/0106724 A1 entitled "FUZZY DATA OPERATIONS," each of which is incorporated herein by reference.

Figure 4:
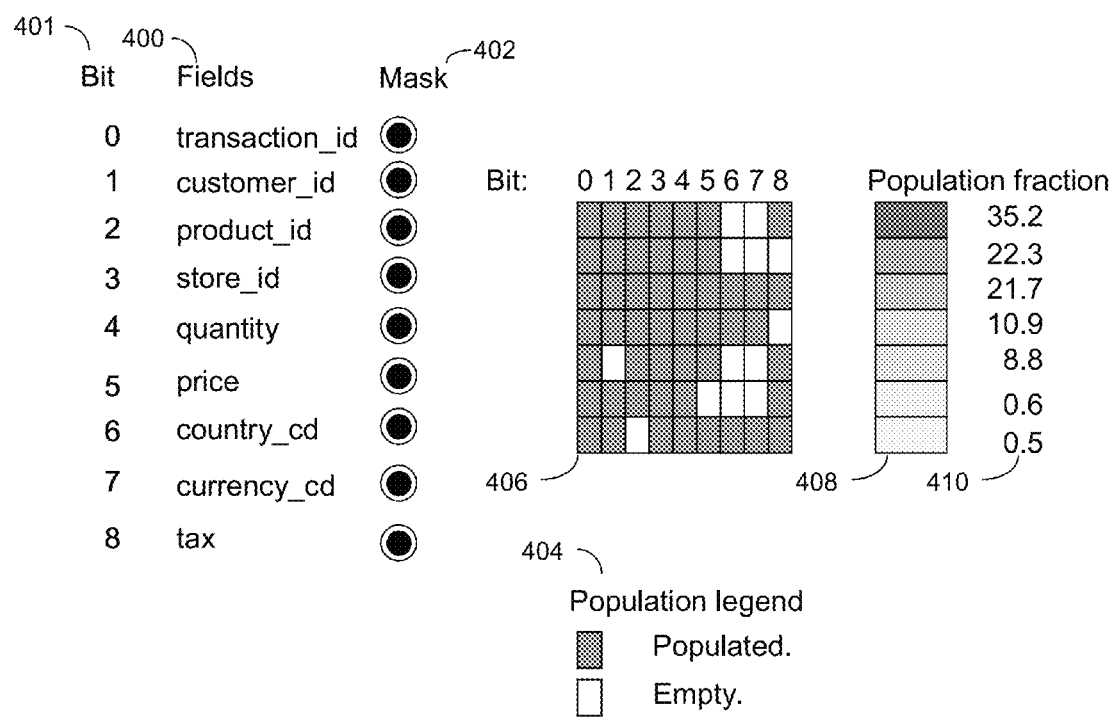
FIGS. 4 and 5 are schematic diagrams of exemplary user interfaces for displaying data pattern codes.

In some implementations, the pattern information can be presented to a user through a graphical display within a user interface presented to the user. This way a user may be able to quickly ascertain a percentage of fields in a record that are populated. FIG. 4 shows an exemplary user interface that includes the list of fields 400, the bit labels 401, and buttons to set the mask 402. The possible settings of the codes for each field are provided in a legend 404. (The choices may differ for each field, and in some implementations the user interface displays different choices for each field.) A diagram 406 indicates which elements are set for each selected field in each distinct pattern (which corresponds to a distinct data pattern code). There is a column for each button selected in the mask 402 (with the corresponding field identified across the top with a label 401) and a row for each distinct pattern. The fraction of records having a given pattern is shown here in grayscale display 408, with darker shades indicating a greater fraction of population, and numerically as a percentage 410.

Figure 5:
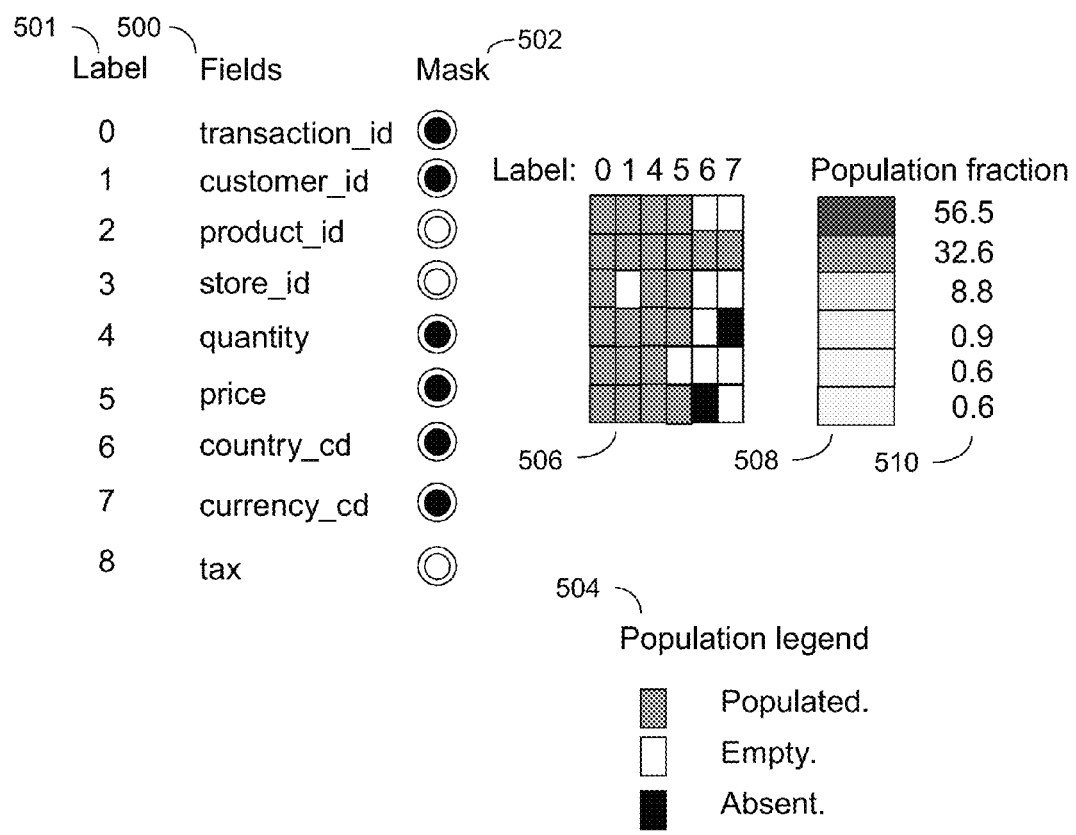

FIG. 5 shows an exemplary user interface when the mask is set selectively and there are more than two data pattern codes for each field. The fields are listed 500 and labels assigned to each field 501. The mask 502 is set by selecting buttons. The legend 504 lists the data pattern codes that are displayed. Here gray levels are used to distinguish the data pattern codes but other possible display representations are possible, including simply displaying a numerical data pattern code. The set of patterns is displayed as a grid 506 with each column corresponding to a field selected in the mask and each row corresponding to a data pattern code indicating a pattern of population. The fraction of population, reflecting the fraction of records having each pattern (associated to the mask and chosen set of data pattern codes), is displayed in grayscale 508 and numerically as a percentage 510.

The data pattern analysis approach described above can be implemented using software for execution on a computer. For instance, the software forms procedures in one or more computer programs that execute on one or more programmed or programmable computer systems (which may be of various architectures such as distributed, client/server, or grid) each including at least one processor, at least one data storage system (including volatile and non-volatile memory and/or storage elements), at least one input device or port, and at least one output device or port. The software may form one or more modules of a larger program, for example, that provides other services related to the design and configuration of dataflow graphs. The nodes and elements of the graph can be implemented as data structures stored in a computer readable medium or other organized data conforming to a data model stored in a data repository.

The software may be provided on a storage medium, such as a CD-ROM, readable by a general or special purpose programmable computer or delivered (encoded in a propagated signal) over a communication medium of a network to the computer where it is executed. All of the functions may be performed on a special purpose computer, or using special-purpose hardware, such as coprocessors. The software may be implemented in a distributed manner in which different parts of the computation specified by the software are performed by different computers. Each such computer program is preferably stored on or downloaded to a storage media or device (e.g., solid state memory or media, or magnetic or optical media) readable by a general or special purpose programmable computer, for configuring and operating the computer when the storage media or device is read by the computer system to perform the procedures described herein. The inventive system may also be considered to be implemented as a computer-readable storage medium, configured with a computer program, where the storage medium so configured causes a computer system to operate in a specific and predefined manner to perform the functions described herein.

A number of embodiments of the invention have been described. Nevertheless, it will be understood that various modifications may be made without departing from the spirit and scope of the invention. For example, some of the steps described above may be order independent, and thus can be performed in an order different from that described.

It is to be understood that the foregoing description is intended to illustrate and not to limit the scope of the invention, which is defined by the scope of the appended claims. For example, a number of the function steps described above may be performed in a different order without substantially affecting overall processing. Other embodiments are within the scope of the following claims.

What is claimed is:

1. A method, including:
   storing, in a data storage system, at least one dataset including a plurality of records; and
   processing, in a data processing system coupled to the data storage system, multiple records of the plurality of records to produce codes representing data patterns in the multiple records, the processing including:
      for each of the multiple records in the plurality of records, associating with the record a code encoding a plurality of elements, wherein each element represents a state or property of a corresponding field or combination of fields as one of a set of element values, and, for at least one element of at least a first code, the number of element values in the set is smaller than the total number of data values that occur in the corresponding field or combination of fields over all of the plurality of records in the dataset;
      determining one or more data patterns characterizing the multiple records based at least in part on the multiple codes associated with the multiple records; and
      processing the multiple records in the plurality of records based on the determined one or more data patterns, including at least one of: processing one or more subsets of the multiple records based on at least one corresponding determined data pattern from the determined one or more data patterns, or determining at least one correlation between states or properties of different fields based on the determined one or more data patterns characterizing the multiple records.

2. The method of claim 1, wherein, for at least one element of the first code, at least two element values in the set represent a state of a field as populated or not populated, respectively.

3. The method of claim 2, wherein the state of not populated includes one of a null state, an absent state, or an empty state.

4. The method of claim 1, wherein, for at least one element of the first code, at least two element values in the set represent a data value occurring in a field being valid or not valid according to a validation rule associated with the field.

5. The method of claim 4, wherein the validation rule defines valid values at least in part by reference to a list of enumerated values.

6. The method of claim 1, wherein, for at least one element of the first code, one or more element values in the set represent a degree to which a data value occurring in a first field matches a target data value.

7. The method of claim 6, wherein the target data value is a data value occurring in a second field.

8. The method of claim 6, wherein at least three element values in the set represent the degree to which the data value occurring in the first field matches the target data value as a mismatch, an exact match, or a fuzzy match, respectively.

9. The method of claim 1, wherein, for at least one element of the first code, at least one element value in the set encodes a data value computed from one or more values occurring in a field or combination of fields of a first record and one or more values occurring in a field or combination of fields of a set of one or more records including at least a second record different from the first record.

10. The method of claim 9, wherein the first record is in a first dataset and the second record is in a second dataset different from the first dataset.

11. The method of claim 1, wherein, for at least one element of at least a second code, at least one element value in the set represents a predetermined data value occurring in a field.

12. The method of claim 11, wherein the number of element values in the set of element values for the element of the second code is equal to the total number of data values that occur in the corresponding field or combination of fields over all of the plurality of records in the dataset.

13. The method of claim 1, wherein processing the one or more subsets of the multiple records includes, for at least one determined data pattern, identifying one or more records representative of that determined data pattern.

14. The method of claim 1, wherein the at least one correlation includes a state of a first field as populated or not populated being correlated to a state of a second field as populated or not populated.

15. A non-transitory computer-readable medium storing a computer program, the computer program including instructions for causing a computer system to:
   store, in a data storage system, at least one dataset including a plurality of records; and
   process, in at least one processor of the computer system coupled to the data storage system, multiple records of the plurality of records to produce codes representing data patterns in the multiple records, the processing including:
      for each of the multiple records in the plurality of records, associating with the record a code encoding a plurality of elements, wherein each element represents a state or property of a corresponding field or combination of fields as one of a set of element values, and, for at least one element of at least a first code, the number of element values in the set is smaller than the total number of data values that occur in the corresponding field or combination of fields over all of the plurality of records in the dataset;

determining one or more data patterns characterizing the multiple records based at least in part on the multiple codes associated with the multiple records; and processing the multiple records in the plurality of records based on the determined one or more data patterns, including at least one of: processing one or more subsets of the multiple records based on at least one corresponding determined data pattern from the determined one or more data patterns, or determining at least one correlation between states or properties of different fields based on the determined one or more data patterns characterizing the multiple records.

16. The non-transitory computer-readable medium of claim 15, wherein, for at least one element of the first code, at least two element values in the set represent a state of a field as populated or not populated, respectively.

17. The non-transitory computer-readable medium of claim 16, wherein the state of not populated includes one of a null state, an absent state, or an empty state.

18. The non-transitory computer-readable medium of claim 15, wherein, for at least one element of the first code, at least two element values in the set represent a data value occurring in a field being valid or not valid according to a validation rule associated with the field.

19. The non-transitory computer-readable medium of claim 18, wherein the validation rule defines valid values at least in part by reference to a list of enumerated values.

20. The non-transitory computer-readable medium of claim 15, wherein, for at least one element of the first code, one or more element values in the set represent a degree to which a data value occurring in a first field matches a target data value.

21. The non-transitory computer-readable medium of claim 20, wherein the target data value is a data value occurring in a second field.

22. The non-transitory computer-readable medium of claim 20, wherein at least three element values in the set represent the degree to which the data value occurring in the first field matches the target data value as a mismatch, an exact match, or a fuzzy match, respectively.

23. The non-transitory computer-readable medium of claim 15, wherein, for at least one element of the first code, at least one element value in the set encodes a data value computed from one or more values occurring in a field or combination of fields of a first record and one or more values occurring in a field or combination of fields of a set of one or more records including at least a second record different from the first record.

24. The non-transitory computer-readable medium of claim 23, wherein the first record is in a first dataset and the second record is in a second dataset different from the first dataset.

25. The non-transitory computer-readable medium of claim 15, wherein, for at least one element of at least a second code, at least one element value in the set represents a predetermined data value occurring in a field.

26. The non-transitory computer-readable medium of claim 25, wherein the number of element values in the set of element values for the element of the second code is equal to the total number of data values that occur in the corresponding field or combination of fields over all of the plurality of records in the dataset.

27. The non-transitory computer-readable medium of claim 15, wherein processing the one or more subsets of the multiple records includes, for at least one determined data pattern, identifying one or more records representative of that determined data pattern.

28. The non-transitory computer-readable medium of claim 15, wherein the at least one correlation includes a state of a first field as populated or not populated being correlated to a state of a second field as populated or not populated.

29. A system, the system including:
a data storage system configured to store at least one dataset including a plurality of records; and
a data processing system, coupled to the data storage system, configured to process multiple records of the plurality of records to produce codes representing data patterns in the multiple records, the processing including:
for each of the multiple records in the plurality of records, associating with the record a code encoding a plurality of elements, wherein each element represents a state or property of a corresponding field or combination of fields as one of a set of element values, and, for at least one element of at least a first code, the number of element values in the set is smaller than the total number of data values that occur in the corresponding field or combination of fields over all of the plurality of records in the dataset;
determining one or more data patterns characterizing the multiple records based at least in part on the multiple codes associated with the multiple records; and
processing the multiple records in the plurality of records based on the determined one or more data patterns, including at least one of: processing one or more subsets of the multiple records based on at least one corresponding determined data pattern from the determined one or more data patterns, or determining at least one correlation between states or properties of different fields based on the determined one or more data patterns characterizing the multiple records.

30. The system of claim 29, wherein, for at least one element of the first code, at least two element values in the set represent a state of a field as populated or not populated, respectively.

31. The system of claim 30, wherein the state of not populated includes one of a null state, an absent state, or an empty state.

32. The system of claim 29, wherein, for at least one element of the first code, at least two element values in the set represent a data value occurring in a field being valid or not valid according to a validation rule associated with the field.

33. The system of claim 32, wherein the validation rule defines valid values at least in part by reference to a list of enumerated values.

34. The system of claim 29, wherein, for at least one element of the first code, one or more element values in the set represent a degree to which a data value occurring in a first field matches a target data value.

35. The system of claim 34, wherein the target data value is a data value occurring in a second field.

36. The system of claim 35, wherein at least three element values in the set represent the degree to which the data value occurring in the first field matches the target data value as a mismatch, an exact match, or a fuzzy match, respectively.

37. The system of claim 29, wherein, for at least one element of the first code, at least one element value in the set encodes a data value computed from one or more values occurring in a field or combination of fields of a first record and one or more values occurring in a field or combination of fields of a set of one or more records including at least a second record different from the first record.

38. The system of claim 37, wherein the first record is in a first dataset and the second record is in a second dataset different from the first dataset.

39. The system of claim 29, wherein, for at least one element of at least a second code, at least one element value in the set represents a predetermined data value occurring in a field.

40. The system of claim 39, wherein the number of element values in the set of element values for the element of the second code is equal to the total number of data values that occur in the corresponding field or combination of fields over all of the plurality of records in the dataset.

41. The system of claim 29, wherein processing the one or more subsets of the multiple records includes, for at least one determined data pattern, identifying one or more records representative of that determined data pattern.

42. The system of claim 29, wherein the at least one correlation includes a state of a first field as populated or not populated being correlated to a state of a second field as populated or not populated.

43. A system, the system including:
means for storing at least one dataset including a plurality of records; and
means for processing multiple records of the plurality of records to produce codes representing data patterns in the multiple records, the processing including:
for each of the multiple records in the plurality of records, associating with the record a code encoding a plurality of elements, wherein each element represents a state or property of a corresponding field or combination of fields as one of a set of element values, and, for at least one element of at least a first code, the number of element values in the set is smaller than the total number of data values that occur in the corresponding field or combination of fields over all of the plurality of records in the dataset;
determining one or more data patterns characterizing the multiple records based at least in part on the multiple codes associated with the multiple records; and
processing the multiple records in the plurality of records based on the determined one or more data patterns, including at least one of: processing one or more subsets of the multiple records based on at least one corresponding determined data pattern from the determined one or more data patterns, or determining at least one correlation between states or properties of different fields based on the determined one or more data patterns characterizing the multiple records.

44. The system of claim 43, wherein, for at least one element of the first code, at least two element values in the set represent a state of a field as populated or not populated, respectively.

45. The system of claim 44, wherein the state of not populated includes one of a null state, an absent state, or an empty state.

46. The system of claim 43, wherein, for at least one element of the first code, at least two element values in the set represent a data value occurring in a field being valid or not valid according to a validation rule associated with the field.

47. The system of claim 43, wherein, for at least one element of the first code, one or more element values in the set represent a degree to which a data value occurring in a first field matches a target data value.

48. The system of claim 47, wherein the target data value is a data value occurring in a second field.

49. The system of claim 43, wherein, for at least one element of the first code, at least one element value in the set encodes a data value computed from one or more values occurring in a field or combination of fields of a first record and one or more values occurring in a field or combination of fields of a set of one or more records including at least a second record different from the first record.

50. The system of claim 49, wherein the first record is in a first dataset and the second record is in a second dataset different from the first dataset.

51. The system of claim 43, wherein processing the one or more subsets of the multiple records includes, for at least one determined data pattern, identifying one or more records representative of that determined data pattern.

52. The system of claim 43, wherein the at least one correlation includes a state of a first field as populated or not populated being correlated to a state of a second field as populated or not populated.

* * * * *